(12) United States Patent
Frances et al.

(10) Patent No.: US 8,436,066 B2
(45) Date of Patent: May 7, 2013

(54) COMPOSITIONS POLYMERIZABLE/CROSSLINKABLE BY CATIONIC/RADICAL IRRADIATION

(75) Inventors: Jean-Marc Frances, Meyzieu (FR); Philippe Barbeau, Genas (FR); Jean-Marie Bernard, Saint Laurent d'agny (FR); Damien Bourgeois, Lyons (FR)

(73) Assignee: Vencorex France, Saint-Priest (FR)

( * ) Notice: Subject to any disclaimer, the term of this patent is extended or adjusted under 35 U.S.C. 154(b) by 719 days.

(21) Appl. No.: 12/309,603

(22) PCT Filed: Jul. 23, 2007

(86) PCT No.: PCT/EP2007/057557
§ 371 (c)(1),
(2), (4) Date: Oct. 9, 2009

(87) PCT Pub. No.: WO2008/012281
PCT Pub. Date: Jan. 31, 2008

(65) Prior Publication Data
US 2010/0035003 A1   Feb. 11, 2010

(30) Foreign Application Priority Data
Jul. 25, 2006   (FR) ..................................... 06 06789

(51) Int. Cl.
| H05B 6/68   | (2006.01) |
| C08G 18/67  | (2006.01) |
| C08G 65/18  | (2006.01) |
| C08G 2/10   | (2006.01) |
| C08F 20/22  | (2006.01) |
| C07D 303/40 | (2006.01) |
| C03C 25/10  | (2006.01) |
| B29D 22/00  | (2006.01) |
| B29D 23/00  | (2006.01) |
| B32B 1/08   | (2006.01) |
| B32B 27/08  | (2006.01) |
| B32B 9/00   | (2006.01) |
| B32B 33/00  | (2006.01) |

(52) U.S. Cl.
USPC ............... 522/1; 522/148; 522/170; 522/168; 522/169; 522/172; 522/174; 522/182; 522/183; 428/35.7; 428/41.4

(58) Field of Classification Search ................. 522/148, 522/170, 168, 169, 172, 174, 182, 183; 428/35.7, 428/414
See application file for complete search history.

(56) References Cited

U.S. PATENT DOCUMENTS

| 5,102,924 A   | * | 4/1992  | Williams et al. ................. 522/4 |
| 5,326,621 A   | * | 7/1994  | Palazzotto et al. ......... 428/195.1 |
| 6,261,665 B1  |   | 7/2001  | Murata et al. |
| 6,716,891 B1  | * | 4/2004  | Meisenburg et al. ........... 522/90 |
| 6,762,272 B1  | * | 7/2004  | Ardaud et al. .................. 528/45 |
| 6,864,311 B2  |   | 3/2005  | Breunig et al. |
| 6,919,385 B2  | * | 7/2005  | Hayashi .......................... 522/25 |
| 6,949,591 B1  | * | 9/2005  | Allard et al. ..................... 522/96 |
| 7,034,063 B2  | * | 4/2006  | Nienhaus et al. ............... 522/91 |
| 7,297,748 B2  | * | 11/2007 | Trivedi ........................ 525/326.6 |
| 7,368,499 B2  | * | 5/2008  | Fenn et al. ..................... 524/522 |
| 7,534,820 B2  | * | 5/2009  | Kohno et al. ................... 522/31 |
| 2006/0039889 A1 |   | 2/2006  | Lafaysse et al. |

FOREIGN PATENT DOCUMENTS

| FR | 2761368 A1 | 10/1998 |
| FR | 2849446 A1 | 7/2004  |

* cited by examiner

*Primary Examiner* — Ling Choi
*Assistant Examiner* — Jessica E Whiteley
(74) *Attorney, Agent, or Firm* — Buchanan Ingersoll & Rooney PC

(57) ABSTRACT

Compositions that can be polymerized and/or crosslinked into coatings by cationic and/or radical irradiation contain at least one photoinitiator and at least one compound having at least one isocyanate function.

8 Claims, No Drawings

COMPOSITIONS POLYMERIZABLE/CROSSLINKABLE BY CATIONIC/RADICAL IRRADIATION

The invention relates to a composition that can undergo cationic and/or radical polymerization and/or crosslinking when irradiated. The invention more particularly relates to a polymerizable and/or crosslinkable composition comprising at least one base compound, at least one photoinitiator and at least one compound comprising at least one isocyanate function, and to its use as a coating.

The field of the invention is that of photopolymer systems that can be crosslinked and/or polymerized when irradiated, in particular with UV radiation or with an electron beam, which can be used especially for forming coatings, such as inks, varnishes or paints.

These compositions are of the type comprising an organic matrix whose constituents bear polymerization/crosslinking reactive functions, and also a photoprimer or photoinitiator which, after absorption of energy, for example UV energy, releases a strong acid: $H^+$ (cationic route) or a free radical (radical route). Cationic photoinitiators thus allow the initiation and propagation of cationic chain polymerizations, while radical photoinitiators (PI) allow the triggering of chain polymerizations via formation of free radicals.

In the field of coatings of varnish type, in particular in the field of varnishes on metal packagings such as drink cans, compounds that can improve the flexibility of the coatings without reducing the reactivity of the systems or the chemical and mechanical strength (especially the scratch resistance) of the coating, are sought.

Compositions that can undergo cationic polymerization/crosslinking under UV irradiation are known and are used as coatings such as varnishes. Such compositions have, for example, as organic matrix a compound comprising aliphatic epoxide functions and a cationic photoinitiator. A coat of varnish based on such a composition, deposited on an aluminum support, for example, shows good chemical and mechanical strength (scratch resistance), but insufficient flexibility (suppleness).

Thus, the present invention proposes a composition that does not have these drawbacks.

To this end, the invention proposes, according to a first subject, a composition that can undergo cationic and/or radical polymerization and/or crosslinking when irradiated, preferably with actinic radiation and/or with an electron beam, comprising:
A) at least one base compound comprising, per molecule, at least one polymerization/crosslinking group, the groups being chosen from the following list: epoxy, oxetane, alkenyl, dioxolane, episulfide, thioxolane, acrylate or methacrylate, hydroxyl;
B) at least one cationic and/or radical photoinitiator;
C) optionally, at least one compound comprising an alcohol or thiol or carboxylic acid function;
D) at least one compound comprising at least one isocyanate function.

In the present invention, cationic irradiation is preferred.

Advantageously, the base compound comprises at least two polymerization/crosslinking groups, these groups preferably being selected from the group of the following combinations of groups: epoxy-epoxy, oxetane-oxetane, dioxolane-dioxolane.

The epoxy, oxetane and dioxolane groups of the invention are preferably aliphatic groups. The epoxy groups are even more preferentially cycloaliphatic.

The base compounds containing two epoxy, oxetane or dioxolane groups are hydrocarbon-based compounds that may comprise ester, amide, carbamate, carbonate, carbonyl, etc. functionalities.

Advantageously, the base compound containing epoxy groups is chosen from the following compounds:

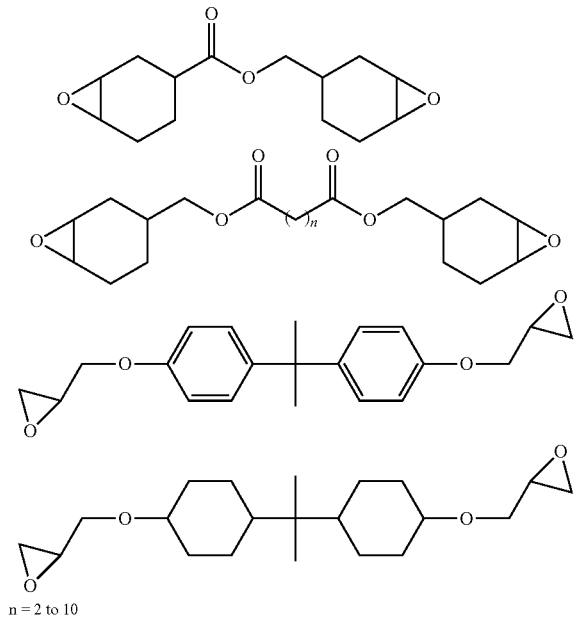

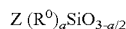
n = 2 to 10

According to one particular embodiment of the invention, the base compound is a crosslinkable and/or polymerizable silicone oligomer and/or polymer that is liquid at room temperature or heat-fusible at a temperature below 100° C., the silicone oligomer and/or polymer comprising:
at least one unit having the following formula:

$Z (R^0)_a SiO_{3-a/2}$ in which:
a=0, 1 or 2,
$R^0$, which may be identical or different, represents an alkyl, cycloalkyl, aryl, vinyl, hydrogeno, hydroxyl or alkoxy radical, preferably a $C_1$-$C_6$ lower alkyl,
Z is an organic substituent comprising at least one epoxy and/or alkenyl ether and/or oxetane and/or dioxolane and/or carbonate reactive function, and
at least two silicon atoms.

The reactive functions Z of the silicone polymer or oligomer may be very varied. However, particularly advantageous coatings are obtained when the silicone oligomer or polymer comprises at least one unit (FS) in which Z represents an organic substituent Z1 comprising at least one epoxy and/or dioxolane reactive function, and preferably at least one epoxy reactive function.

According to two advantageous alternatives of the present invention, the silicone oligomer or polymer containing at least one epoxy and/or dioxolane reactive function Z1, and preferably at least one epoxy reactive function Z1, may:
(i) either solely comprise this or these type(s) of reactive function(s) Z1,
(ii) or comprise other reactive functions Z such as alkenyl ether, oxetane and/or carbonate reactive functions Z2.

In the case of the first alternative (i), the composition may also comprise other silicone oligomers and/or polymers other than the oligomer/polymer described above, comprising other reactive functions Z2 such as alkenyl ether, oxetane and/or carbonate functions and optionally reactive functions Z1.

As examples of reactive functions Z, they may be chosen especially from the following radicals:

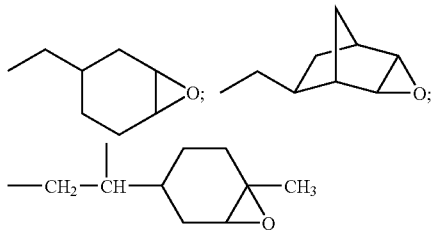

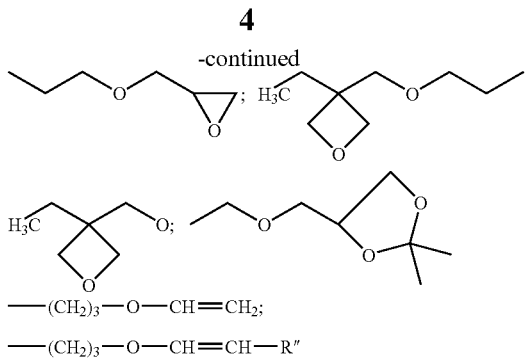

with R– representing a linear or branched $C_1$-$C_6$ alkyl radical.

According to a second advantageous variant of the present invention, the silicone polymer or oligomer is constituted by at least one silicone having the following average formula:

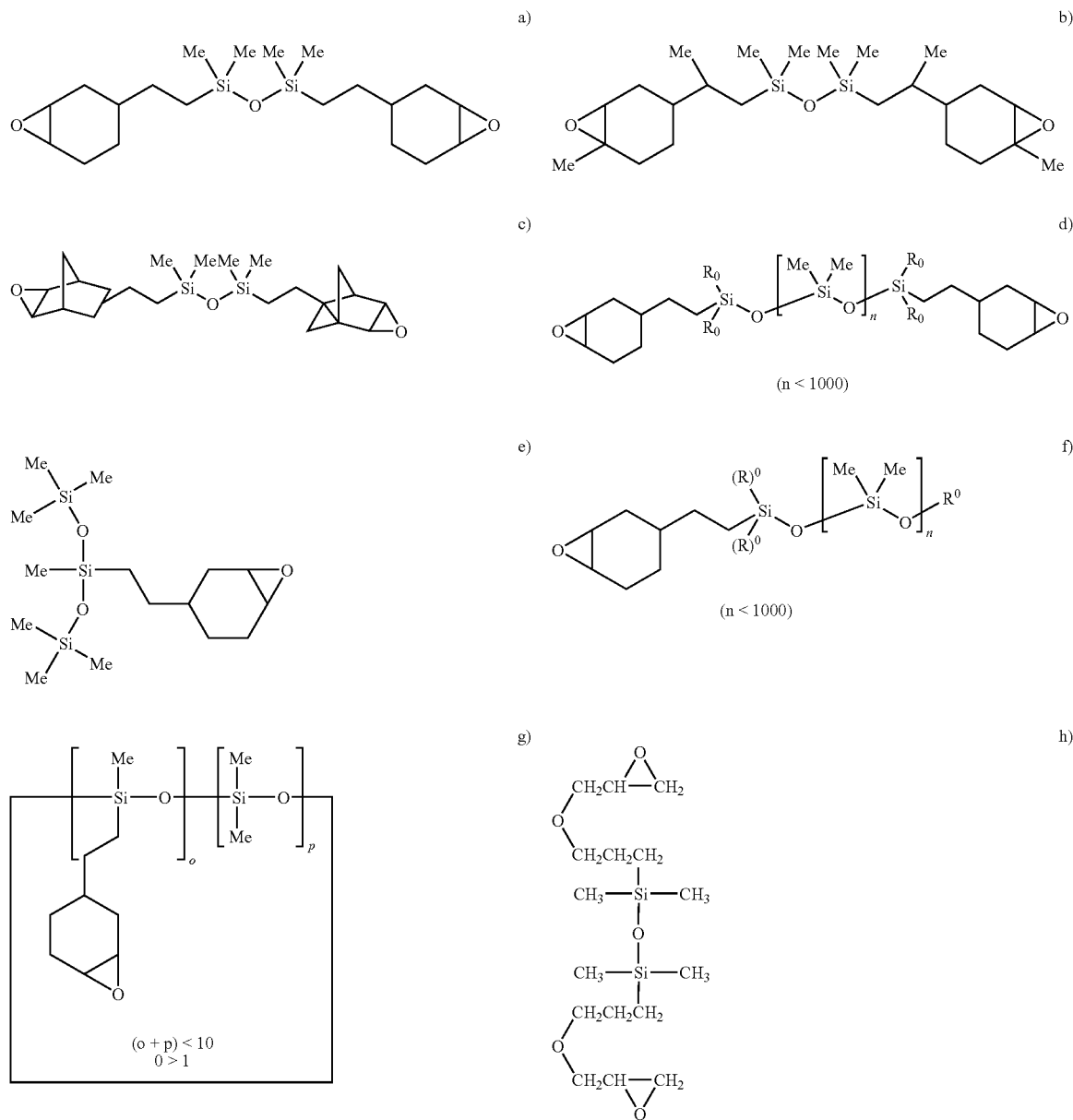

-continued

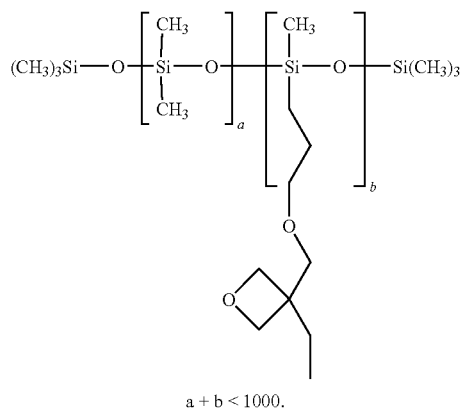

i)

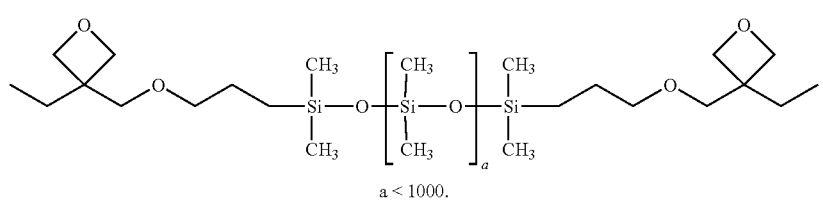

j)

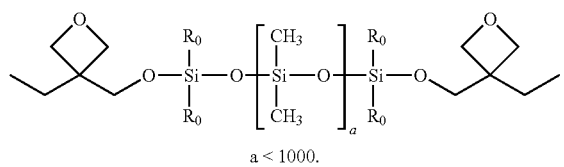

k)

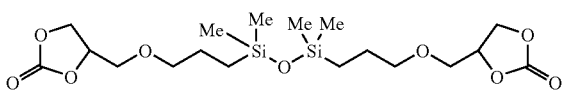

l)

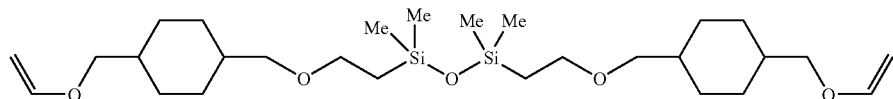

m)

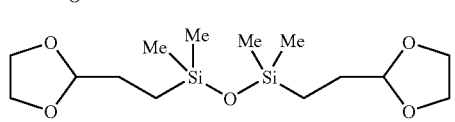

n)

In these formulae, $R_0$ or $(R)^0$ = alkyl (preferably $C_1$-$C_{10}$) or aryl (preferably phenyl).

The term "alkenyl" means a linear or branched, saturated or unsaturated hydrocarbon-based chain containing at least one olefinic double bond, and more preferably only one double bond. Preferably, the "alkenyl" group contains from 2 to 8 carbon atoms and better still from 2 to 6 carbon atoms. This hydrocarbon-based chain optionally comprises at least one heteroatom such as O, N or S.

Preferred examples of "alkenyl" groups are vinyl, allyl and homoallyl groups; vinyl being particularly preferred.

When the base compound comprises alkenyl groups, they may be "activated" alkenyl groups such as alkenyl ether or styrene, which will polymerize in the presence of the photoinitiator, especially a cationic photoinitiator. They may also be "non-activated" alkenyl groups such as allylic groups. These "non-activated" alkenyl groups may polymerize in the presence of a radical photoinitiator and of a compound comprising thiol functions. An example of such a reaction that may be mentioned is the photopolymerization of thiol-enes. Such a reaction is described in the publication "Photopolymerization of thiol-enes: some recent advances" (Rad. Tech. 2001, Oct. 8-10, 2001, conference proceedings, pp. 219-224).

According to another particular embodiment of the invention, at least one of the groups of the base compound is a linear or cyclic alkenyl ether group. In this case, the base compound is advantageously chosen from the following list:

vinyl ethers, in particular triethylene glycol divinyl ether (Rapidcure® CHVE-3, GAF Chemical Corp.), cyclic vinyl ethers or acrolein tetramers and/or dimers and the vinyl ether having the following formula:

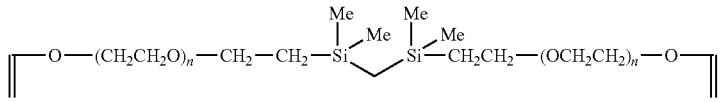

propenyl ethers,
and butenyl ethers.

According to one particular embodiment of the invention, the base compound also comprises functions (or precursors of these functions) that can polymerize with the isocyanate functions of compound D. These may be, for example, alcohol or thiol functions. The base compound may comprise, for example, at least one epoxy and/or oxetane group, and also an alcohol function. Examples of such base compounds that may be mentioned include glycidol and trimethylolpropane oxetane.

According to one particular embodiment of the invention, at least one of the groups of the base compound is an acrylate or methacrylate group. In this case, the base compound is advantageously chosen from the following list:
- epoxidized acrylates, preferably the oligomer of bisphenol-A epoxydiacrylate (Ebecryl 600),
- acrylo-glycero-polyester, preferably the trifunctional acrylate oligomer mixture obtained from glycerol and polyester (Ebecryl 810),
- multifunctional acrylates, preferably pentaerythrityl triacrylate (PETA), trimethylolpropane triacrylate (TMPTA), 1,6-hexanediol diacrylate (HDDA), trimethylolpropane ethoxylate triacrylate, thiodiethylene glycol diacrylate, tetraethylene glycol diacrylate (TEGDA), tripropylene glycol diacrylate (TPGDA), triethylene glycol diacrylate (TEGDA) or trimethylolpropane trimethacrylate (TMPTMA),
- acrylo-urethanes,
- acrylo-polyethers,
- acrylo-polyesters,
- unsaturated polyesters,
- acrylo-acrylics.

According to yet another particular embodiment of the invention, at least one of the groups of the base compound is a hydroxyl group. In this case, the base compound is advantageously a polyol of formula:

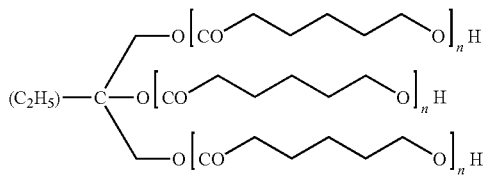

The base compound may also be an oligomer or a polymer. The base compound comprises the crosslinking/polymerization groups mentioned above, or precursors of these groups.

Initiation of the photopolymerization and/or crosslinking of the composition according to the invention is made possible by virtue of the presence of the cationic and/or radical photoprimer or photoinitiator. These photoprimers or photoinitiators are well known to those skilled in the art. The composition of the invention comprises an effective amount of photoinitiator. The term "effective amount" means an amount that is sufficient to initiate crosslinking.

The cationic photoinitiators are generally onium salts. The cationic species of the photoinitiator may be, for example, an iodonium, a sulfonium (mono- or polysulfonium), an oxoisothiochromanium, etc. Such cationic species are described, for example, in document FR 2 761 368. The anionic species of the photoinitiator may be, for example, a borate as described in document FR 2 761 368. It may be, for example, a hexafluoroantimonate, a hexafluorophosphate, a trifluoromethylsulfonate, etc.

Radical photoinitiators are well known and are generally based on benzophenones or aromatic ketones such as 2-hydroxy-2-methyl-1-phenyl-1-propanone.

According to one particular embodiment of the invention, the composition comprises a compound C containing at least one alcohol or thiol or carboxylic acid function, preferably an alcohol or thiol function. The alcohol is advantageously primary or secondary. This alcohol may also be used as solvent for the photoinitiator.

Advantageously, the alcohol is chosen from the following group: isopropyl alcohols, benzyl alcohols, diacetone alcohol, cyclohexanol, butyl lactate and trimethylolpropane oxetane.

The alcohol may also be chosen from polyols such as diols, triols or polyols. Nonlimiting examples that may be mentioned include butanediol, hexanediol, cyclohexanediol, glycerol, pentaerythritol and trimethylolpropane.

The compound bearing at least one alcohol function may also be chosen from polyol polymers such as polyols of polyester, polyacrylic, polyether or polyamide structure.

The compound comprising a thiol function may be a polythiol.

Examples of compounds comprising at least one thiol function that may be mentioned include butanethiol, hexanethiol, 1,3-glyceryl dithioglycolate, 1,6-dithiohexane, 1,8-dimercapto-3,6-dioxaoctane, etc.

The compound may comprise both a thiol function and an alcohol function. Examples that may be mentioned include mercaptoethanol, thioglycerol, etc.

The compound C may also be an oligomer or a polymer.

The composition of the invention comprises a compound comprising at least one isocyanate function. This compound is advantageously a polyisocyanate.

The term "polyisocyanate" means a compound comprising at least two isocyanate functions.

The polyisocyanate of the invention is preferably a polyisocyanate of formula (I) below:

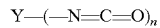

in which Y is a substituted or unsubstituted aromatic, aliphatic, cycloaliphatic or heterocyclic multivalent group optionally comprising heteroatoms and n is at least equal to 1. Examples of polyisocyanates that may be suitable are isophorone diisocyanate, 1,3- and 1,4-cyclohexane diisocyanate, 1,2-ethylene diisocyanate, 1,4-tetramethylene diisocyanate, 1,6-hexamethylene diisocyanate, 2,2,4- and 2,4,4-trimethyl-1,6-hexamethylene diisocyanate, 1,12-dodecane diisocyanate, α,α'-diisocyanatodipropyl ether, 1,3-cyclobutane diisocyanate, 2,2- and 2,6-diisocyanato-1-methylcyclohexane, 2,5- and 3,5-bis(isocyanatomethyl)-8-methyl-1,4-methanodecahydronaphthalene, 1,5-, 2,5-, 1,6- and 2,6-bis(isocyanatomethyl)-4,7-methanohexahydroindane, 1,5-, 2,5- and 2,6-bis(isocyanato)-4,7-methanohexahydroindane, 2,4'- and 4,4'-dicyclohexyl diisocyanate, 2,4- and 2,6-hexahydrotolylene diisocyanate, perhydro-2,4'- and 4,4'-diphenylmethane diisocyanate, α,α'-diisocyanato-1,4-diethylbenzene, 1,3- and 1,4-phenylene diisocyanate, 4,4'-diisocyanatobiphenyl, 4,4'-diisocyanato-3,3'-dichlorobiphenyl, 4,4'-diisocyanato-3,3'-dimethoxybiphenyl, 4,4'-diisocyanato-3,3'-dimethylbiphenyl, 4,4'-diisocyanato-3,3'-diphenylbiphenyl, 2,4'- and 4,4'-diisocyanatodiphenylmethane, 1,5-naphthylene diisocyanate, 2,4- and 2,6-tolylene diisocyanate, N,N'-(4, 4'-dimethyl-3,3'-diisocyanatodiphenyl)uretdione, m-xylylene diisocyanate, dicyclohexylmethane diisocyanate, tetramethylxylylene diisocyanate, 2,4,4'-triisocyanatodiphenyl ether, 4,4',4''-triisocyanatotriphenylmethane, and analogues and mixtures. Examples of such polyisocyanate oligomers that may be mentioned include isocyanurate trimers (HDI trimers) such as Tolonate HDT® from the company Rhodia and biurets such as Tolonate HDB® from the company Rhodia. Other examples of isocyanate oligomers are aliphatic isocyanate oligomers such as asymmetric hexamethylene diisocyanate trimer, and also hexamethylene diisocyanate derivatives of high functionality and low viscosity, and norbornene diisocyanate dimers and trimers.

According to one particular embodiment of the invention, the polyisocyanate is a mixture of polyisocyanate compounds with a mean functionality of between 2 and 8 (limits inclusive) and preferably with a functionality of between 3 and 7 (limits inclusive). The functionality is defined as being the number of isocyanate functions borne by each of the molecules of which the mixture is composed.

Examples of polyisocyanate mixtures that may be mentioned include isocyanurate trimers such as hexamethylene diisocyanate trimer (HDT) with a mean functionality of about 3.5.

Isocyanurate polyisocyanate derivatives of tolylene diisocyanate (TDI) or methanediphenyl isocyanate (MDI) polymers may also be used.

According to another preferred embodiment of the invention, the polyisocyanate is a diisocyanate, i.e. a polyisocyanate comprising two isocyanate functions, or a triisocyanate, i.e. a polyisocyanate comprising three isocyanate functions.

The polyisocyanate of the invention is advantageously aliphatic, and is preferably chosen from hexamethylene diisocyanate and derivatives thereof.

The compound comprising at least one isocyanate function of the invention advantageously has a viscosity (at 25° C. and 100% solids) of between 10 and 50 000 mPa·s and preferably between 100 and 20 000 mPa·s.

According to one particular embodiment of the invention, the compound comprising at least one isocyanate function is other than a prepolymer or a polymer.

The polyisocyanate compounds may optionally comprise other functions such as urea and/or biuret and/or carbamate and/or allophanate and/or ester and/or carbonate and/or ether and/or amide and/or acylurea bonds.

The composition of the invention may also comprise at least one photosensitizer selected from optionally metallic (poly)aromatic products and heterocyclic products, and preferably chosen from the following list of products: phenothiazine, tetracene, perylene, anthracene, 9,10-diphenylanthracene, thioxanthone, 2-chlorothioxanthen-9-one, 1-chloro-4-propoxy-9H-thioxanthen-9-one, isopropyl-OH-thioxanthen-9-one, 2 and 4 isomer mixtures, 2-isopropyl-9H-thioxanthen-9-one, benzophenone, [4-(4-methylphenylthio)phenyl]phenylmethanone, 4-benzyl-4'-methyldiphenyl sulfide, acetophenone, xanthone, fluorenone, anthraquinone, 9,10-dimethylanthracene, 2-ethyl-9,10-dimethyloxyanthracene, 2,6-dimethylnaphthalene, 2,5-diphenyl-1,3,4-oxadiazole, xanthopinacol, 1,2-benzanthracene and 9-nitroanthracene, and mixtures thereof.

The composition of the invention may also comprise other additives, such as dyes, fillers (silicone or nonsilicone), surfactants, mineral reinforcing fillers (siliceous or nonsiliceous), bactericides, corrosion inhibitors, binding bases, organosilicon compounds or epoxidized compounds, such as alkoxysilanes, epoxycycloaliphatics or epoxyetheraliphatics, flexibilizers, leveling agents, adhesion promoters, pigments, etc.

In the case of the compositions of the invention that can undergo cationic polymerization/crosslinking when irradiated, the proportion (by weight relative to the weight of the composition) of compounds A, B, C and D in the composition of the invention is advantageously as follows:
- compound A: greater than or equal to 30%, preferably greater than or equal to 50% and even more preferentially greater than or equal to 70%,
- compound B: between 0.1% and 10% (limits inclusive) and preferably between 0.5% and 5% (limits inclusive),
- compound C: less than or equal to 80%, preferably less than or equal to 50%, even more preferentially less than or equal to 20% and ultimately between 5% and 10% (limits inclusive),
- compound D: between 1% and 70% (limits inclusive), preferably between 1.5% and 50% (limits inclusive) and even more preferentially between 2% and 30% (limits inclusive).

In the case of the compositions of the invention that can undergo radical polymerization/crosslinking when irradiated, the proportion (by weight relative to the weight of the composition) of compounds A, B, C and D in the composition of the invention is advantageously as follows:
- compound A: greater than or equal to 30%, preferably greater than or equal to 50% and even more preferentially greater than or equal to 70%,
- compound B: between 0.01% and 10% (limits inclusive) and preferably between 0.1% and 5% (limits inclusive),
- compound C: less than or equal to 80%, preferably less than or equal to 50% and even more preferentially less than or equal to 20%,
- compound D: between 1% and 70% (limits inclusive), preferably between 1.5% and 50% (limits inclusive) and even more preferentially between 2% and 30% (limits inclusive).

In a second subject, the invention also relates to a process for coating a support, characterized in that the composition described above is applied to a support.

This may be any known type of support. Examples of supports that may be mentioned include supports made of wood, plastic, metal such as aluminum or steel, etc. The support is advantageously metallic.

Advantageously, the process comprises the following steps:
- coating the support using the composition as described above to form at least one coating layer (at least partial) on the support,
- crosslinking the coating layer by irradiation.

The composition of the invention may be applied to the support, for example, by any suitable coating or transfer means (for example a doctor blade, a coating roll, photogravure, dynamic screen printing, a brush, spraying: pneumatic or electrostatic gun, etc.).

The crosslinking of the coating applied to the support to be coated may be activated, for example by heating the impregnated or even coated support to a temperature of between 30 and 250° C. and preferably between 50 and 250° C., obviously taking into account the maximum heat resistance of the support. The duration of heating of the support is generally between 30 seconds and one hour. When the duration of heating of the support is short, for example between 30 seconds and a few minutes, the maximum temperature reached by the support is advantageously between 30 and 150° C. and preferably between 50 and 150° C.

The heat-activation means are of the type that are known and suitable for this purpose, for example an oven or IR radiation.

During the implementation of a standard process of cationic irradiation, for example in the presence of a monomer and a photoinitiator, certain areas of the coating are occasionally not irradiated, and thus not polymerized.

Now, the use of compound D comprising an isocyanate function in the invention allows the polymerization of the areas of the coating that have not been irradiated. This represents a considerable advantage in terms of the properties of the coating.

The composition of the invention may also be an adhesive composition used for the processing of laminated materials (for instance in the case of packaging materials). The composition is then applied to a support, irradiated with UV in order to obtain an adhesive layer that is dry to the touch and thereby transportable in the form of a roll, for example. The support thus coated may then be subsequently reprocessed by lamination to form a multilayer system, and then by any other process for obtaining an object of three-dimensional form of the desired form. The stiffness of the final material is then obtained by heat activation of the adhesive as described above. The two steps of irradiation and heat activation, which may be performed separately, afford flexibility to the processes for preparing coated supports.

The deposition rate of the composition on the support varies as a function of the field of application of the composition. In the field of coatings in general, the deposition rate is usually less than or equal to 80 g/m². In the field of varnishes for metallic packaging boxes such as drink cans, the deposition rate is generally between 2 and 30 g/m².

In a third subject, the present invention also relates to the coated support (or composite) that may be obtained according to the process described above.

This composite is characterized in that it comprises:
a support,
at least one coating layer (at least partial) obtained from the composition as defined above.

The coating layer(s) of this composite has (have) good properties in terms of chemical resistance and mechanical strength (especially scratch resistance), but also in terms of suppleness and flexibility.

The coating layer(s) of this composite has (have) good properties of resistance to UV rays and good fastness (durability).

In a fourth subject, the invention relates to any manufactured article comprising composite as described above. It may be, for example, sheet metal, metallic packaging boxes such as drink cans, etc.

In a fifth subject, the invention relates to the use of the composition of the invention as a varnish, adhesive or ink. The invention relates in particular to the use as a varnish for a metallic packaging box.

Finally, in a sixth subject, the invention relates to the use of a compound comprising an isocyanate function as described above in irradiation-crosslinkable/polymerizable compositions. It relates in particular to the use of such compositions as varnish, adhesive, ink or paint.

Other details or advantages of the invention will emerge more clearly in the light of the examples that are given below, purely as a guide.

Tests

MEK test: One drop of methyl ethyl ketone (MEK) is placed on the film of varnish. A watch glass is placed on top and the MEK is left to act for 3 minutes. Next, the product is removed by dabbing up gently with a soft cloth, and the surface state of the film is then examined. The result is scored from 0 to 5, 0 corresponding to no effect, and 5 corresponding to complete destruction of the film:

0: the film is not attacked, the reagent leaves no trace;

1: a mark corresponding to the contour of the drop is observed. The interior is identical to the rest of the film in terms of appearance and feel;

2: loss of gloss is observed, or the film is tacky (considerably softened), or coloration is observed;

3: the film cumulates two or three of the defects of point 3;

4: the film is folded or sticky and does not really have any cohesion. A wet edge at the periphery of the drop may also be observed;

5: the film has been completely destroyed, and the support is bare.

Flexibility of the layers ("T-bend"): a strip 5 to 10 mm wide of the varnished support is cut out and one end of the strip is folded over, with the varnished face always to the exterior. By continuing to fold the same end in the same manner, the fold is less and less clean, and at a certain point the coating bears no mark due to the fold (cracking, crazing, etc.). The result on the test is the number of turns made by the end to arrive at this point (2.5=2 turns plus half a turn=5 consecutive folds).

Hardness: mention is made herein of the pencil hardness. This is measured using a standard set of pencils ranging from hardness 7B to 7H.

EXAMPLES

In the examples, the following monomers are used as base compounds A:

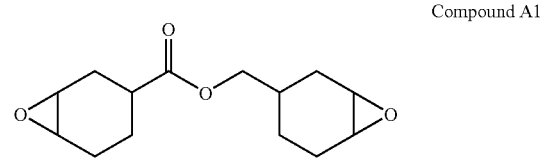

Compound A1

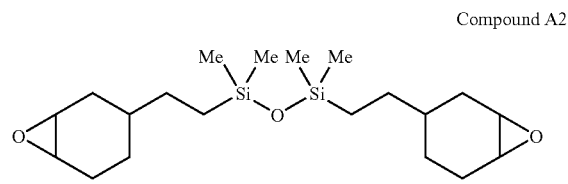

Compound A2

The photoinitiator having the following structure is also used as compound B:

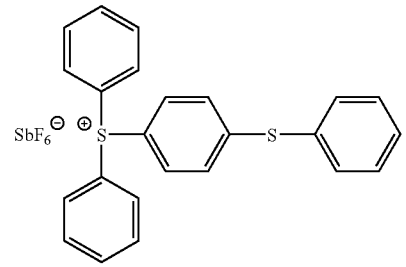

-continued

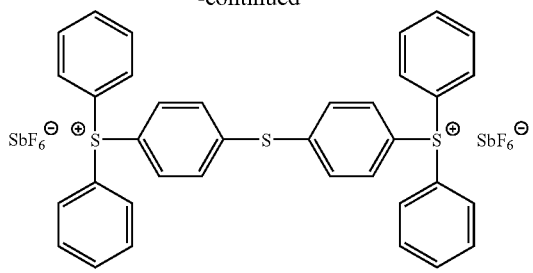

This is a mixture of salts of arylsulfonium hexafluoroantimonate type.

Benzyl alcohol is used as compound C.

Hexamethylene diisocyanate (HDI) oligomers sold by Rhodia under the brand name Tolonate® are used as compound D. The main characteristics of these compounds are given hereinbelow:

| Compound | Product name | Viscosity (mPa·s) | Content of isocyanate functions (weight % expressed as NCO) |
|---|---|---|---|
| D1 | Tolonate HDT | 2400 | 22.0 |
| D2 | Tolonate HDT-LV | 1200 | 23.0 |
| D3 | Tolonate HDT-LV2 | 600 | 23.0 |
| D4 | Tolonate XFD90B | 2000 | 17.4 |

Comparative Example

The following mixture of constituents is prepared:

| Product | Amount (g) |
|---|---|
| Compound A1 | 80 |
| Compound C | 10 |
| Compound B | 5 |

A clear, colorless solution is obtained.

Application to an aluminum plate (of Pechiney type for cans) using a No. 2 Meyer type threaded coating bar leads to a uniform film without dewetting. After treating with UV (speed of 10 m/min under two mercury lamps at 190 W/cm), a film that is dry to the touch with a thickness of about 5 μm is obtained.

Example 1

The following mixture of constituents is prepared:

| Product | Amount (g) |
|---|---|
| Compound A1 | 80 |
| Compound C | 10 |
| Compound D2 | 10 |
| Compound B | 5 |

A clear, colorless solution is obtained.

Application to an aluminum plate (of Pechiney type for cans) using a No. 2 Meyer type threaded coating bar leads to a uniform film without dewetting. After treating with UV (speed of 10 m/min under two mercury lamps at 190 W/cm), a film that is dry to the touch with a thickness of about 5 μm is obtained.

The same formulation is applied in the same manner to another bare support 4 hours and 24 hours after its preparation. After treating with UV (speed of 10 m/min under two mercury lamps at 190 W/cm), a film that is dry to the touch with a thickness of about 5 μm is again obtained.

After UV irradiation, the crosslinking can also be terminated by curing in an oven at 200° C. for 1 min. The films obtained then have the following properties:

| Formulation | Comparative example | Example 1 |
|---|---|---|
| State of the film | C | C |
| MEK at t + 1 h | 0 | 0 |
| Hardness at D + 7 | 2H | H |
| T-bend at D + 7 | 2.5 | 0.5 |

(C = crosslinked, ST = slightly tacky, T = tacky, NC = not crosslinked)
(Test with MEK: 0 = no degradation, 5 = complete destruction of the film)

A marked improvement in the suppleness of the coating, without deterioration of the other properties, is observed.

Examples 2 to 5

Compositions in which the proportion of each compound is indicated in the table hereinbelow are prepared:

| | Example | | | |
|---|---|---|---|---|
| | 2 | 3 | 4 | 5 |
| Product | Amount (g) | Amount (g) | Amount (g) | Amount (g) |
| Compound A1 | 15.5 | 15.5 | 15.5 | 15.5 |
| Compound C | 1.7 | 1.7 | 1.7 | 1.7 |
| Compound D1 | 2.95 | | | |
| Compound D2 | | 2.95 | | |
| Compound D3 | | | 2.9 | |
| Compound D4 | | | | 3.23 |
| Compound B | 0.7 | 0.7 | 0.7 | 0.7 |

Application to an aluminum plate (of Pechiney type for cans) using a No. 2 Meyer type threaded coating bar leads to a uniform film without dewetting. After treating with UV (speed of 10 m/min under two mercury lamps at 190 W/cm) followed by curing for 1 min in an oven at 200° C., a film that is dry to the touch with a thickness of about 5 μm is obtained.

The final properties are collated in the table hereinbelow:

| | Example | | | |
|---|---|---|---|---|
| | 2 | 3 | 4 | 5 |
| State of the film | C | C | C | C |
| MEK | 1 | 0 | 1 | 1 |
| Hardness | H | H | 2H | H |
| T-bend | 0.5 | 0.5 | 0.5 | 0.5 |

(C = crosslinked, ST = slightly tacky, T = tacky, NC = not crosslinked)
(Test with MEK: 0 = no degradation, 5 = complete destruction of the film)

Example 6

The following mixture of constituents is prepared:

| Product | Amount (g) |
| --- | --- |
| Compound A2 | 80 |
| Compound C | 10 |
| Compound D2 | 10 |
| Compound B | 5 |

A clear, colorless solution is obtained.

Application to an aluminum plate (of Pechiney type for cans) using a No. 2 Meyer type threaded coating bar leads to a uniform film without dewetting. After treating with UV (speed of 10 m/min under two mercury lamps at 190 W/cm), a film that is dry to the touch with a thickness of about 5 μm is obtained.

The invention claimed is:

1. A composition that can undergo cationic polymerization when irradiated, comprising:
   A) at least one base compound having at least two polymerizable functional groups selected from the group consisting of epoxy-epoxy, oxetane-oxetane, and dioxolane-dioxolane;
   B) at least one cationic photoinitiator;
   C) optionally, at least one compound having an alcohol or thiol or carboxylic acid function; and
   D) at least one compound having at least one isocyanate function.

2. The composition as defined by claim 1, wherein said composition is irradiated with actinic radiation and/or with an electron beam.

3. The composition as defined by claim 1, comprising at least one base compound with epoxy groups selected from the group consisting of:

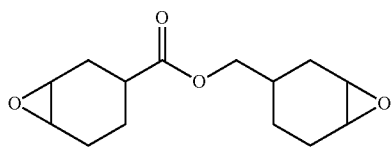

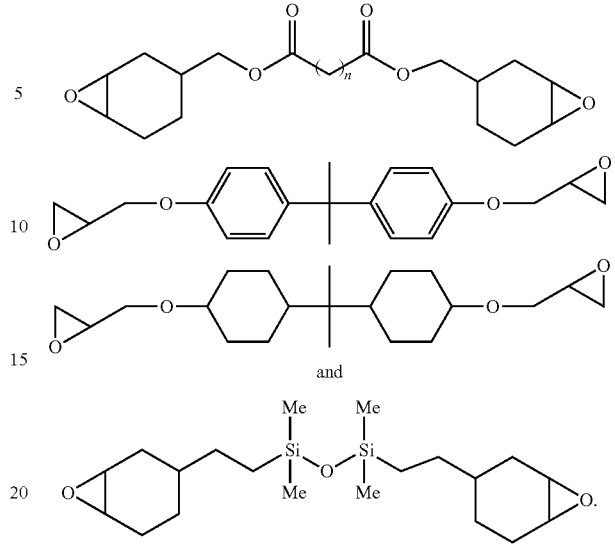

and $n = 2$ to $10$

4. The composition as defined by claim 1, comprising a compound C containing a thiol or alcohol function.

5. The composition as defined by claim 1, wherein the at least one compound comprising an isocyanate function is a polyisocyanate of formula (I):

$$Y-(-N{=}C{=}O)_n$$

in which Y is a substituted or unsubstituted aromatic, aliphatic, cycloaliphatic or heterocyclic multivalent group optionally comprising heteroatom(s) and n is at least equal to 1.

6. The composition as defined by claim 5, wherein the polyisocyanate comprises a diisocyanate or a triisocyanate.

7. A process for coating a support substrate, comprising depositing thereon a composition as defined by claim 1.

8. The process as defined by claim 7, comprising the following steps:
   coating the support substrate with the composition to form at least one coating layer, whether partial or total, on the support substrate, and,
   polymerizing the coating layer by irradiation.

* * * * *